(12) United States Patent
Adam et al.

(10) Patent No.: US 7,511,317 B2
(45) Date of Patent: Mar. 31, 2009

(54) POROUS SILICON FOR ISOLATION REGION FORMATION AND RELATED STRUCTURE

(75) Inventors: Thomas N. Adam, Poughkeepsie, NY (US); Stephen W. Bedell, Wappingers Falls, NY (US); Joel P. de Souza, Putnam Valley, NY (US); Kathryn T. Schonenberg, Wappingers Falls, NY (US); Thomas A. Wallner, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 206 days.

(21) Appl. No.: 11/423,286

(22) Filed: Jun. 9, 2006

(65) Prior Publication Data

US 2007/0284674 A1 Dec. 13, 2007

(51) Int. Cl.
*H01L 27/082* (2006.01)
*H01L 27/102* (2006.01)

(52) U.S. Cl. .................................. 257/197; 257/565

(58) Field of Classification Search ......... 257/197–198, 257/565–576
See application file for complete search history.

(56) References Cited

U.S. PATENT DOCUMENTS 6,277,703 B1    8/2001    Barlocchi et al.
6,358,849 B1    3/2002    Havemann et al.
6,384,469 B1 *  5/2002    Chantre ....................... 257/565
6,437,417 B1    8/2002    Gilton
2001/0038132 A1 * 11/2001 Ahn et al. ................... 257/385
2004/0002214 A1  1/2004   Mizutani et al.
2004/0124439 A1  7/2004   Minami et al.

* cited by examiner

*Primary Examiner*—Cuong Q Nguyen
(74) *Attorney, Agent, or Firm*—Todd M C Li; Hoffman Warnick LLC (57) ABSTRACT

A method of forming an isolation region using porous silicon and a related structure are disclosed. One embodiment of the method may include forming a collector region; forming a porous silicon region in the collector region; forming a crystalline silicon intrinsic base layer over the collector region, the intrinsic base layer extending over a portion of the porous silicon region to form an extrinsic base; and forming an isolation region in the porous silicon region. The method is applicable to forming an HBT having a structure including a crystalline silicon intrinsic base extending beyond a collector region and extending over an isolation region to form a continuous intrinsic-to-extrinsic base conduction path of low resistance. The HBT has improved performance by having a smaller collector to intrinsic base interface and larger intrinsic base to extrinsic base interface.

4 Claims, 8 Drawing Sheets

POROUS SILICON FOR ISOLATION REGION FORMATION AND RELATED STRUCTURE

BACKGROUND OF THE INVENTION

1. Technical Field

The invention relates generally to microelectronic fabrication, and more particularly, to a method of using porous silicon for transistor isolation formation and a related structure.

2. Background

Figure 1:
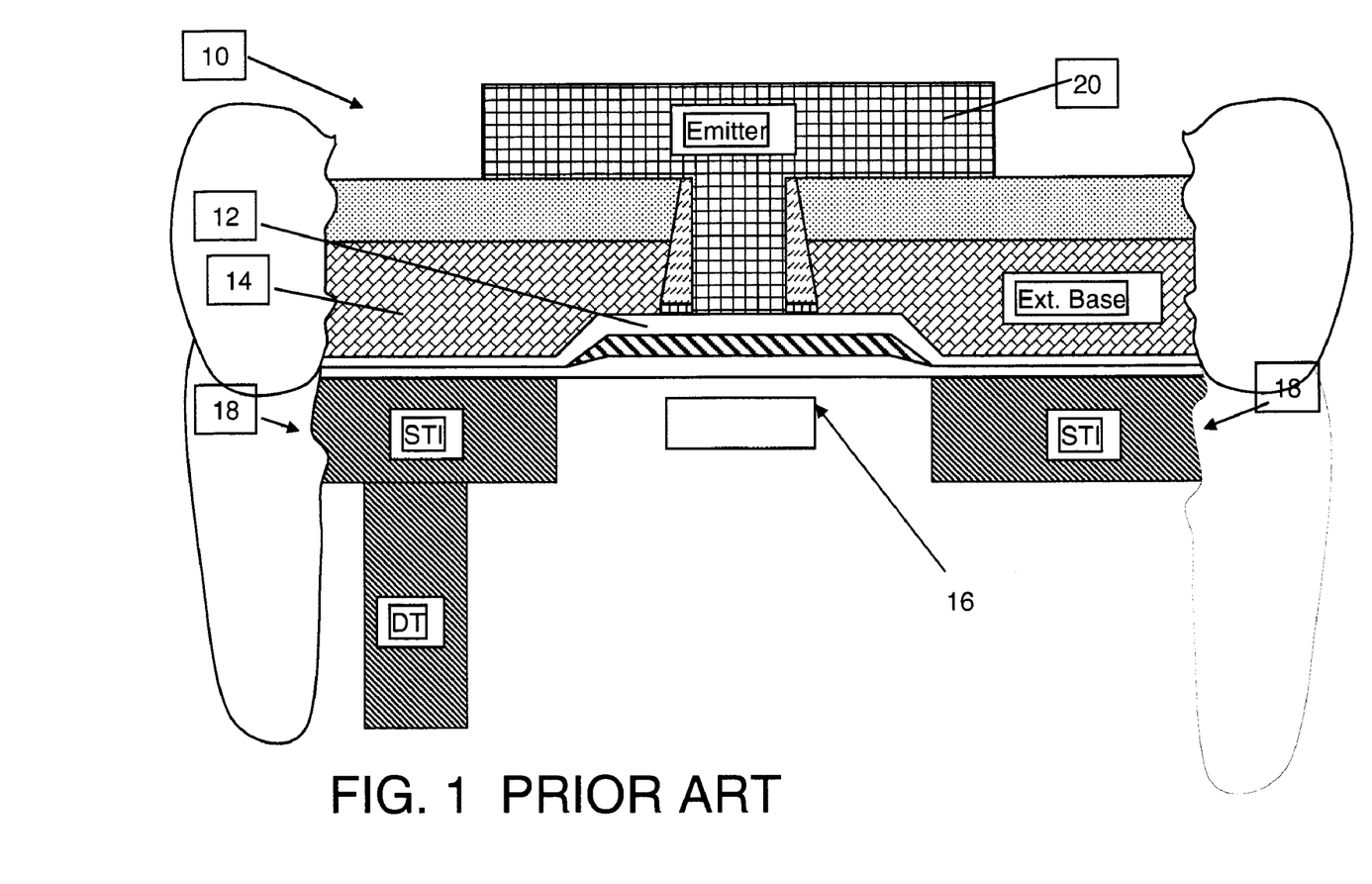
FIG. 1 shows a conventional HBT.

Traditional scaling of silicon-germanium (SiGe) hetero-junction bipolar transistors (HBTs) has two parts: vertical scaling and lateral scaling. FIG. 1 shows a conventional HBT 10 including an intrinsic base region 12, an extrinsic base region 14, a collector region 16, isolation regions 18 and an emitter 20. Vertical scaling typically involves changing the thickness, germanium profile, and dopant profile of intrinsic base region 12. Lateral scaling typically involves reducing collector 16 width to reduce collector 16 to base 12, 14 capacitance, which is a major parasitic component limiting maximum power gain frequency $F_{max}$ of HBT 10. Unfortunately, conventional lateral scaling cannot carry device performance much further than currently achievable. More specifically, when HBT 10 is scaled laterally, collector 16 narrows, which creates less overlap between intrinsic base 12 and collector 16. This structure disadvantageously results in reduced parasitic collector 16 to base 12 capacitance $C_{cb}$. Unfortunately, the overlap area between intrinsic base 12 and extrinsic base 14 is also reduced. The reduction of overlap area between extrinsic base 14 and intrinsic base 12 creates a very narrow region for electrons to flow, and therefore increases base resistance $R_b$ dramatically. Since maximum frequency $F_{max}$ is dependent on the resistance-to-capacitance (RC) time constant of $R_b C_{cb}$, little or no net increase in $F_{max}$ is observed.

It should be recognized that the above-description is a simplified explanation of the scaling problem. However, the ideal case remains that base resistance $R_b$ and collector-to-base capacitance $C_{cb}$ should be minimized. However, achieving this ideal case requires two structural situations that are difficult to accommodate simultaneously. That is, to achieve the minimum base resistance $R_b$, a large overlap area between intrinsic base 12 and extrinsic base 14 is required. In contrast, to achieve the minimum collector-to-base capacitance $C_{cb}$, a small overlap area between intrinsic base 12 and collector 16 is required.

With a traditional HBT 10 it is difficult to create both structures simultaneously, and achieve maximum device performance. In particular, when forming HBT 10, it is typical to create isolation regions 18 such as shallow trench isolations (STI) that insulate the base region 12, 14 and collector 16. Trench isolations 18 are usually formed using some type of silicon oxide. When epitaxially growing intrinsic base 12, the base grows as a single crystal on any exposed single crystal silicon, i.e., over collector 16, and grows as polysilicon on any non-single crystal silicon region, i.e., over trench isolations 18. Hence, it grows as polysilicon over trench isolation 18. Polysilicon has higher resistance than comparably doped crystalline silicon, contributing to higher $R_b$. In HBTs 10, this creates a very narrow single crystal intrinsic base 12 and large polysilicon extrinsic base 14, which creates a high base resistance $R_b$ and negatively affects device performance.

In view of the foregoing, there is a need in the art for a solution to the problems of the related art that will permit simultaneous reduction of the parasitic collector-to-base capacitance $C_{cb}$ and base resistance $R_b$.

SUMMARY OF THE INVENTION

A method of forming an isolation region using porous silicon and a related structure are disclosed. One embodiment of the method may include forming a collector region; forming a porous silicon region in the collector region; forming a crystalline silicon intrinsic base layer over the collector region, the intrinsic base layer extending over a portion of the porous silicon region; and subsequently forming an isolation region in the porous silicon region. The method is applicable to forming an HBT having a structure including a crystalline silicon intrinsic base extending beyond a collector region and extending over an isolation region to form a continuous intrinsic-to-extrinsic base conduction path of low resistance. The HBT has improved performance by having a smaller collector to intrinsic base interface and larger intrinsic base to extrinsic base interface.

A first aspect of the invention provides a structure comprising: a crystalline silicon intrinsic base extending beyond a collector region and extending over an isolation region.

A second aspect of the invention provides a method comprising: forming a collector region; forming a porous silicon region in the collector region; forming a crystalline silicon intrinsic base layer over the collector region, the intrinsic base layer extending over a portion of the porous silicon region to form an extrinsic base; and subsequently forming an isolation region in the porous silicon region.

A third aspect of the invention provides a method of forming a hetero-junction bipolar transistor (HBT), the method comprising: forming a collector region; forming a porous silicon region in the collector region; forming a crystalline silicon intrinsic base layer over the collector region, the intrinsic base layer extending over a portion of the porous silicon region to form an extrinsic base; forming an isolation region in the porous silicon region; and forming an extrinsic base layer and emitter to complete the HBT.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIGS. 3-9B show embodiments of a method according to the invention.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 2:
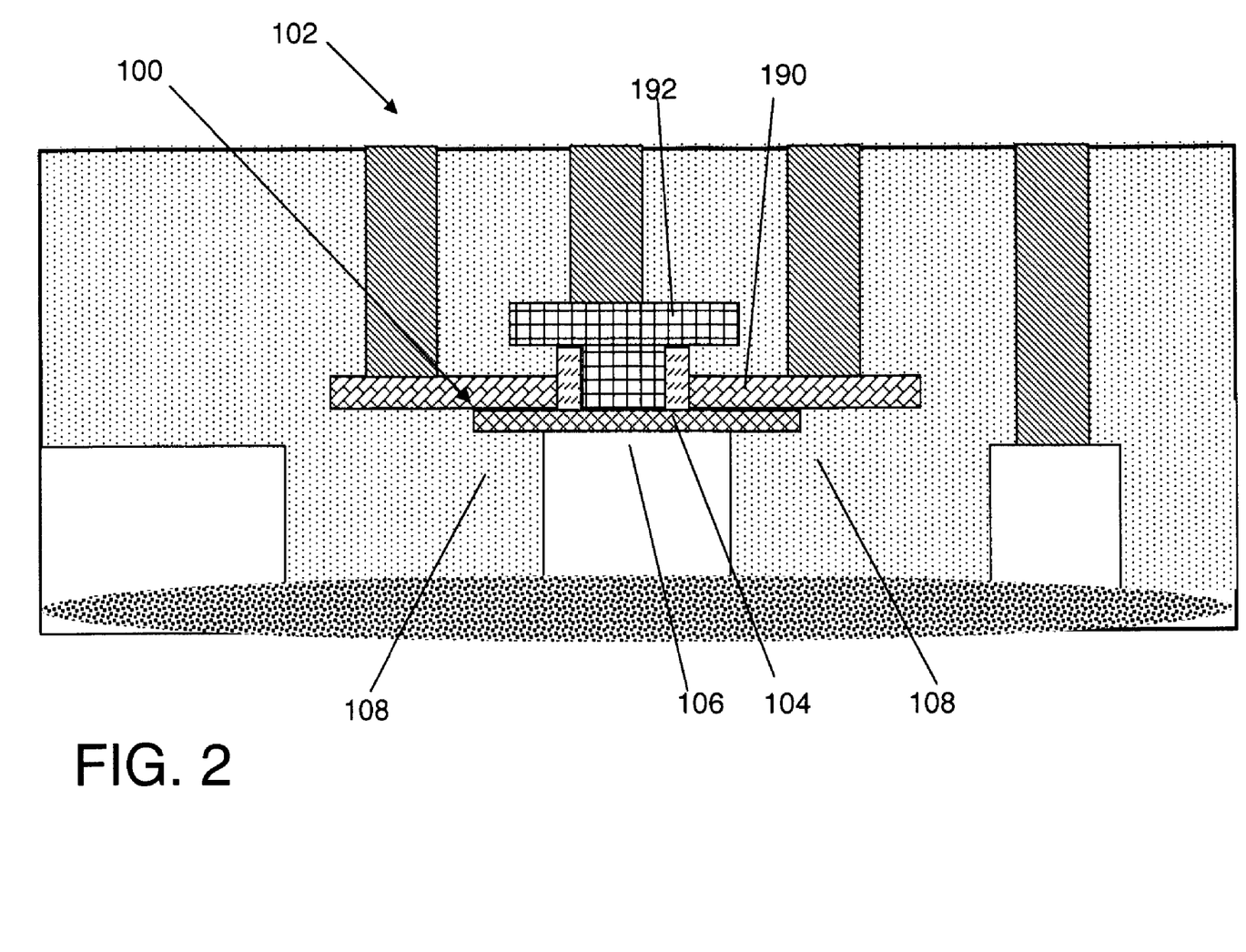
FIG. 2 shows an HBT including a structure according to one embodiment of the invention.

Turning to the drawings, FIG. 2 shows a structure 100 as part of a hetero-junction bipolar transistor (HBT) 102. Structure 100 includes a crystalline silicon intrinsic base 104 extending beyond a collector region 106 and extending over an isolation region 108 (two shown). Isolation region 108, as will be described further below, may include a porous dielectric such as porous silicon oxide, porous silicon nitride, crystalline silicon oxide, or another porous oxide.

Figure 3:
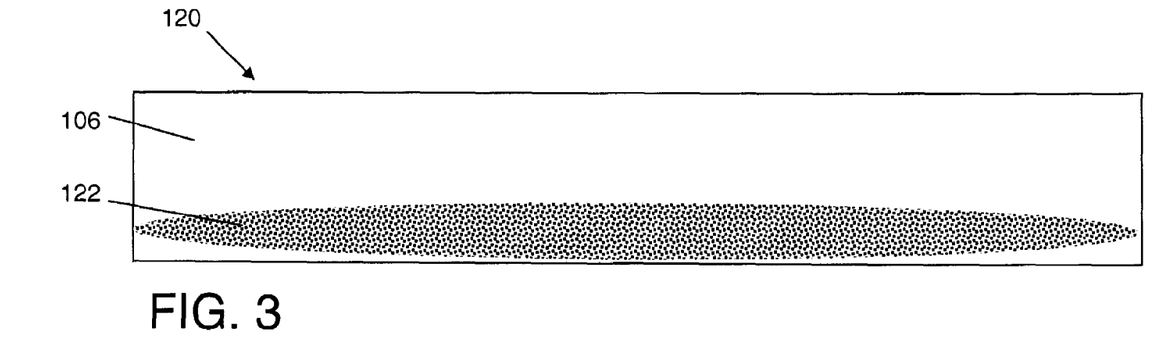

Referring to FIGS. 3-9B, embodiments of a method of forming structure 100 will be described. In FIG. 3, a collector region 106 is formed. In one embodiment, this formation may include any now known or later developed techniques for forming a collector region. For example, FIG. 3 shows providing a silicon substrate 120 with a sub-collector 122 (e.g., from n-type doping such as arsenic (As)). Areas above sub-collector 122 are also n-type doped and used as collector region 106.

Figure 4:
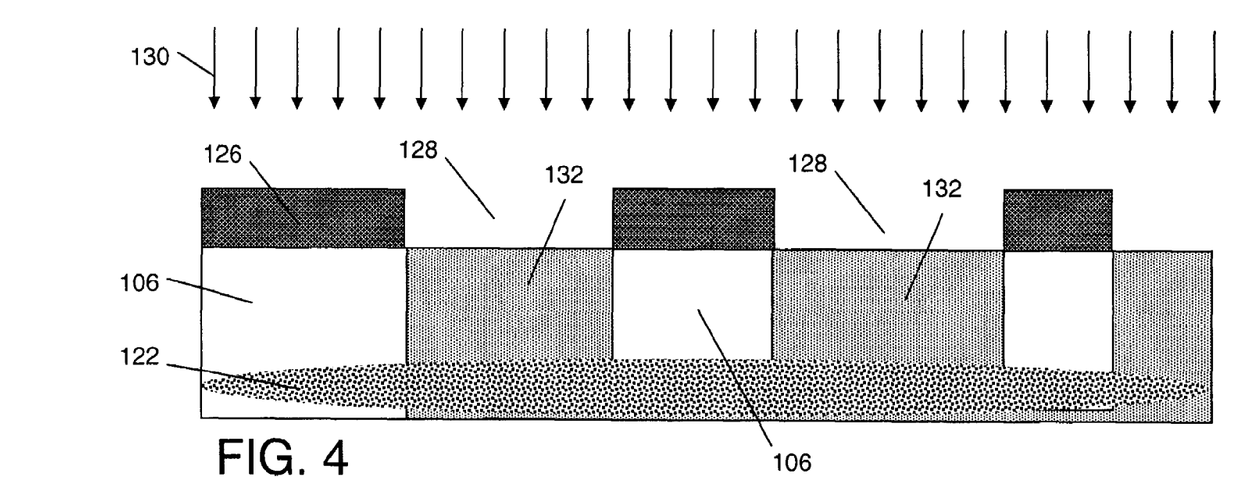
Figure 5:
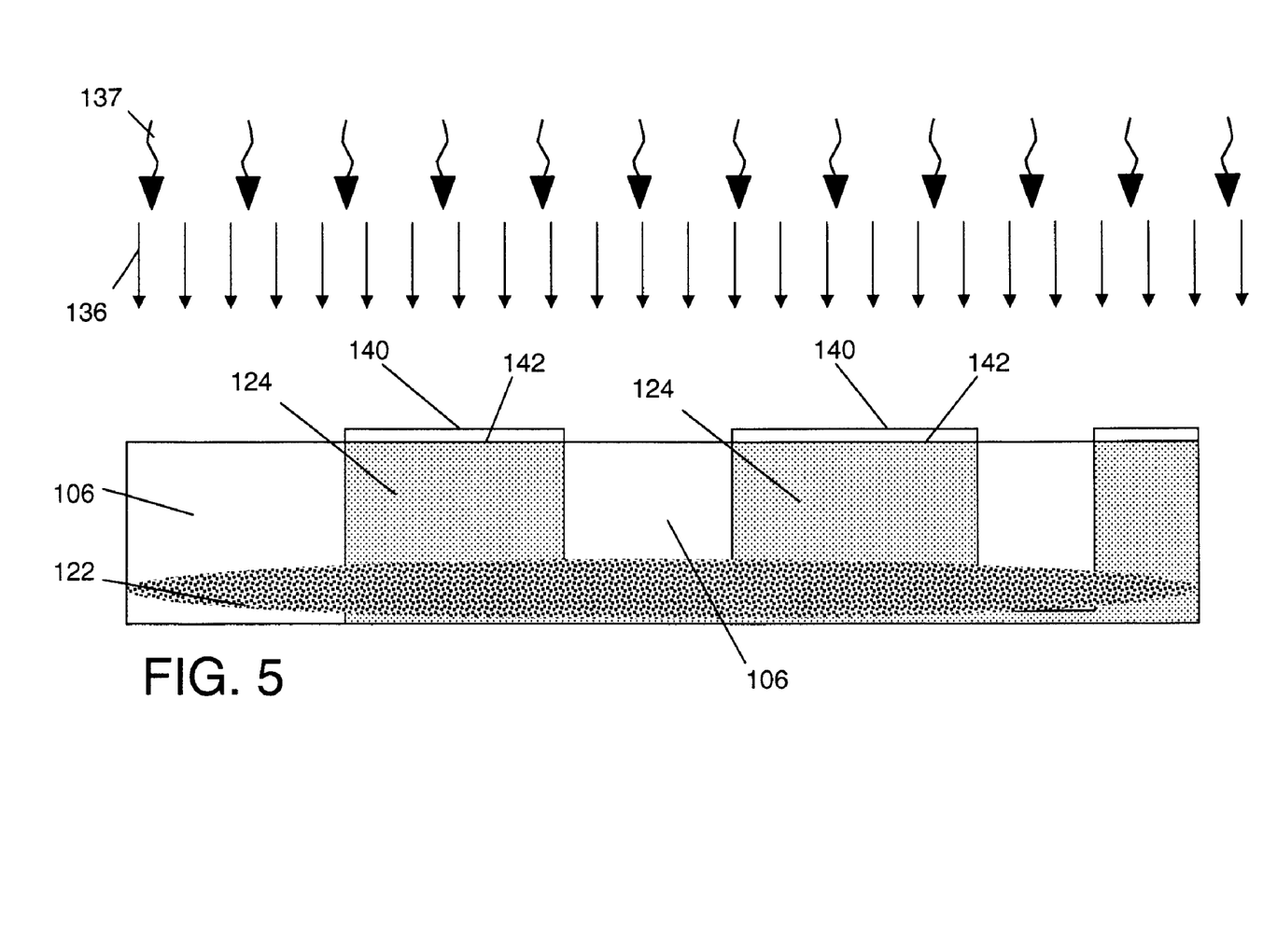
Figure 6:
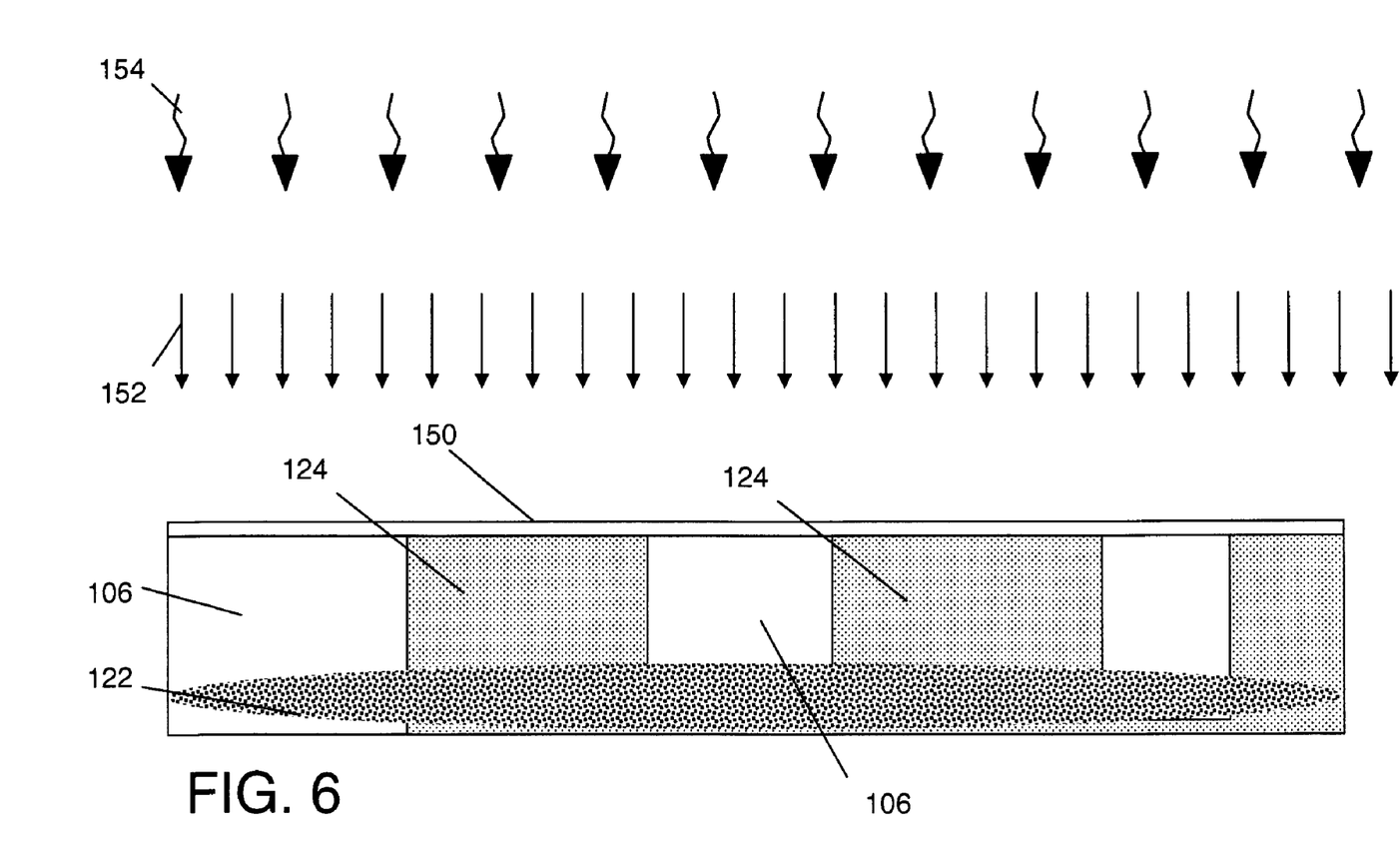

Next, as shown in FIGS. 4-6, a porous silicon region 124 (shown in FIGS. 5 and 6) is formed in collector region 106. "Porous silicon" is single crystalline silicon with pores therein. Porous silicon may be, for example, e.g., 70% porous. First, as shown in FIG. 4, a photoresist 126 is deposited and patterned to define areas 128 that will be used to form trench isolations 108 (FIG. 2). Photoresist 126 may include any now known or later developed photoresist material suitable for implanting. Photoresist 126 covers collector region (s) 106. Areas 128 are implanted 130 with a dopant, e.g., boron (B), to form lightly p-type doped regions 132 for formation of trench isolations 108 (FIG. 2).

The remainder of the process of forming porous silicon region 124 (FIGS. 5 and 6) may occur in a number of ways. In one embodiment, shown in FIG. 5, a porous etching 136 is performed to form porous silicon region 124. Porous etching 136 may include, for example, passing a current through single crystal silicon, i.e., at least doped regions 132 (FIG. 4), while the structure is in a hydrofluoric (HF) acid solution. This process etches away silicon within p-type doped regions 132 and leaves porous silicon region 124 (FIG. 5). Other techniques of forming porous silicon region 124 also may be employed. This process may also include annealing 137 in, for example, a hydrogen ($H_2$) ambient, to form a skin layer 140 of single crystalline silicon on a surface 142 of porous silicon region 124. The annealing may include using a temperature of, for example, approximately 700 to approximately 1000° C.

In an alternative embodiment, shown in FIG. 6, a silicon layer 150 is epitaxially grown across collector region 106 and doped regions 132 (FIG. 4), and porous etching 152 is performed to form porous silicon region 124. Silicon layer 150 should be lightly doped p-type silicon and may have a thickness of approximately 50 to approximately 300 angstroms. Porous etching 152 is substantially similar to that described above and results in the formation of porous silicon region 124, except that due to its low dopant concentration, silicon layer 150 is substantially less porous than the rest of porous silicon region 124. An optional annealing 154 may also be performed at this stage to remove defects in silicon layer 150, but is not necessary. Annealing 154 may use a temperature of, for example, approximately 700 to approximately 1000° C.

Figure 7:
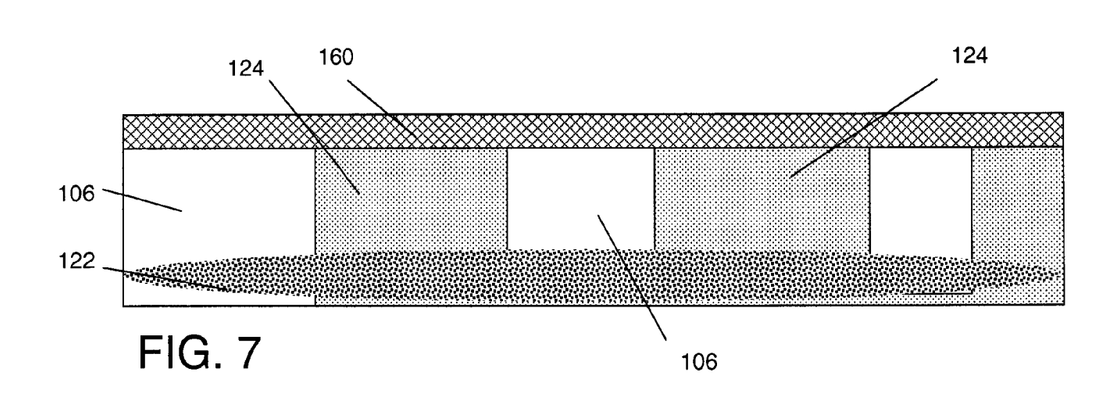
Figure 8:
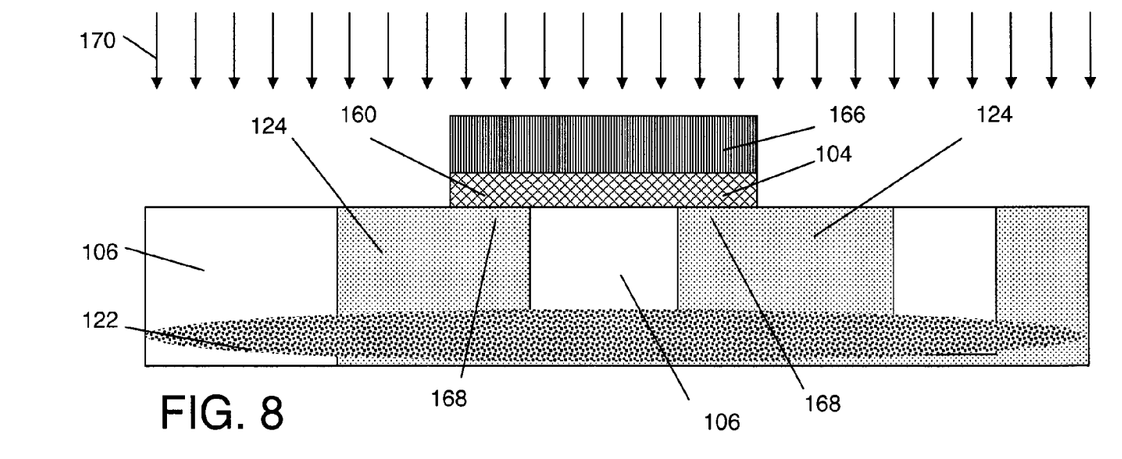

Next, as shown in FIG. 7, a crystalline silicon intrinsic base layer 160 is formed over collector region 106. Silicon layer 150 (FIG. 6) or skin layer 140 (FIG. 5) are incorporated into intrinsic base layer 160. Intrinsic base layer 160 extends over porous silicon region 124. Next, as shown in FIG. 8, intrinsic base layer 160 is patterned using a photoresist 166 and etched 170 such that intrinsic base layer 160 extends over a portion 168 of porous silicon region 124 for use as intrinsic base 104 (FIG. 2) of HBT 102 (FIG. 2) and to form an extrinsic base, i.e., as part of extrinsic base 190 (FIG. 2). Etching 170 may include any appropriate etching for silicon.

Figure 9A:
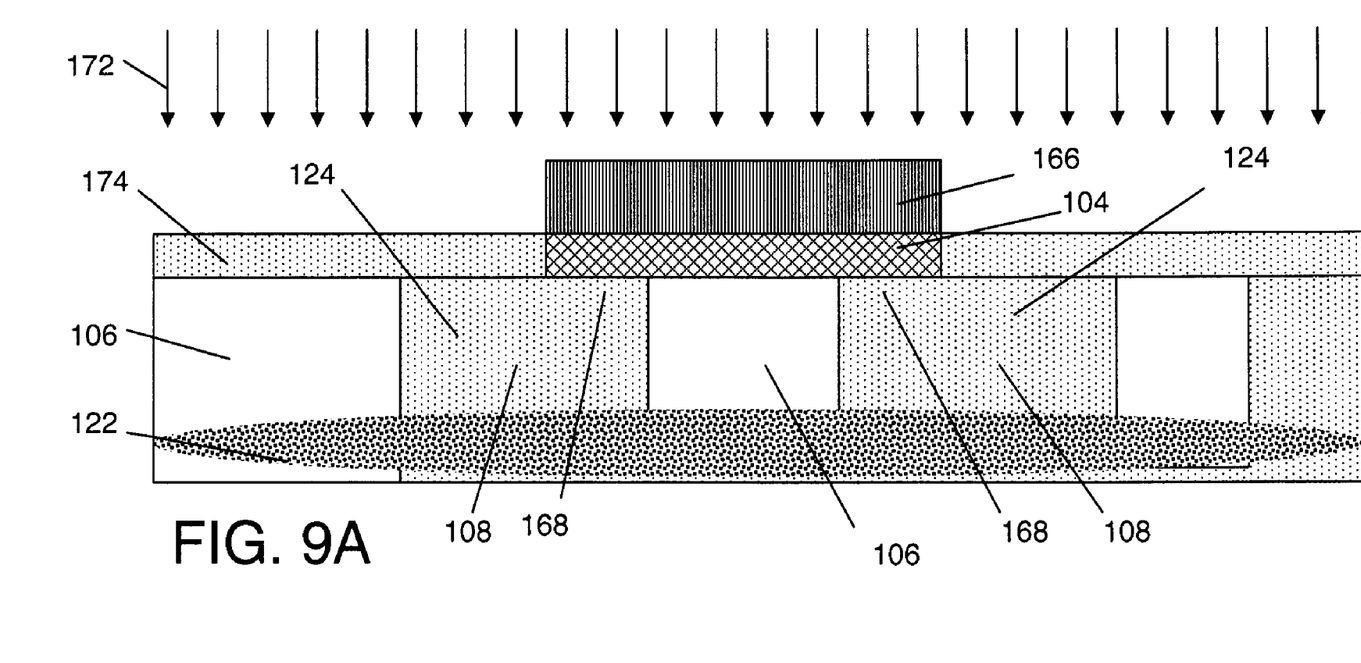
Figure 9B:
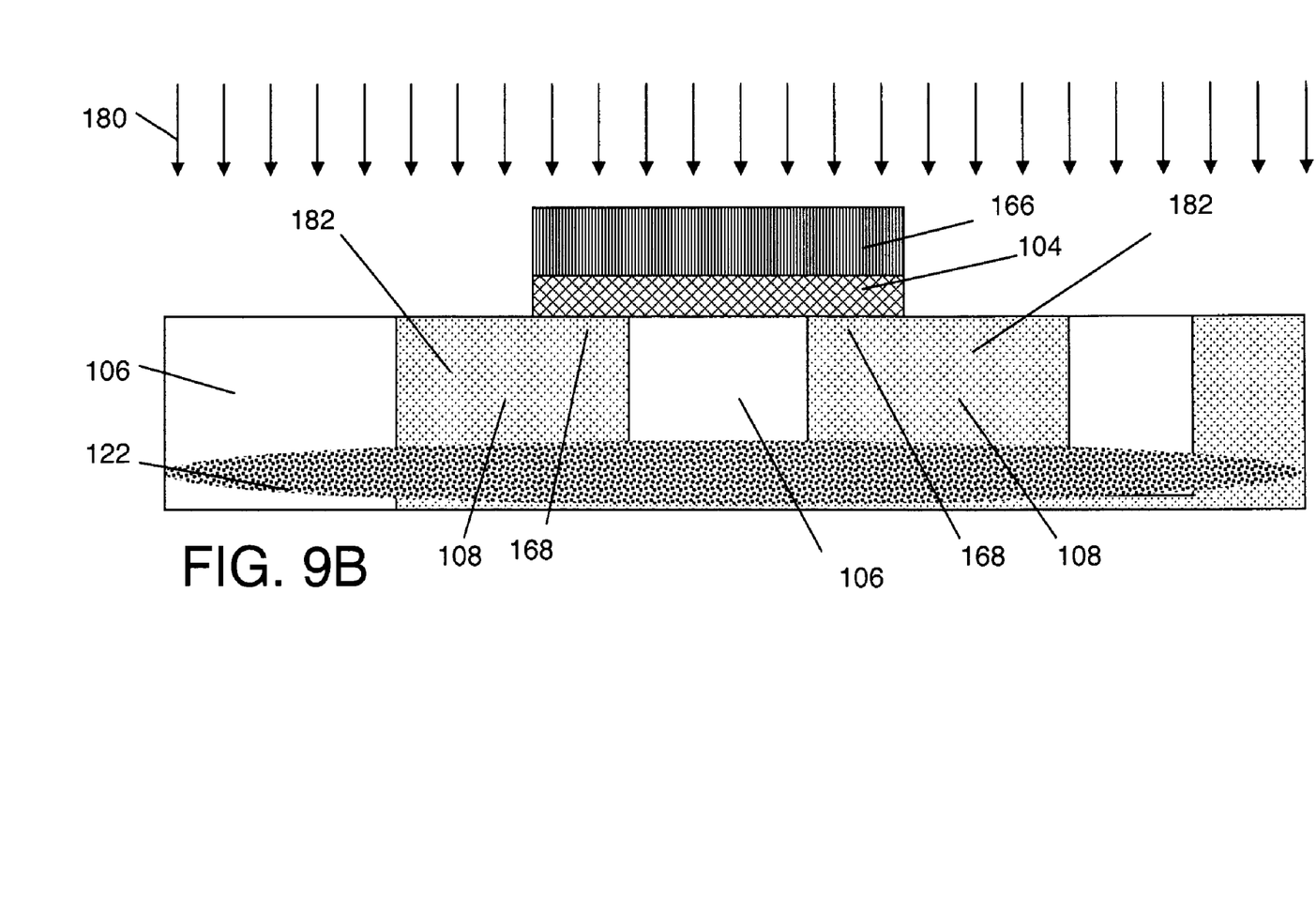

FIGS. 9A-B show forming of an isolation region 108 in porous silicon region 124. This process may be provided in a number of ways. As shown in FIG. 9A, in one embodiment, porous silicon region 124 may be oxidized 172 to convert it to a porous silicon dielectric such as silicon oxide ($SiO_2$) or silicon nitride ($Si_3N_4$), which is used as trench isolation 108. Oxidization 172 may form, for example, a silicon oxide layer 174 over isolation region 108 and collector region 106, where they are not covered by intrinsic base 104. In an alternative embodiment shown in FIG. 9B, porous silicon region 124 (FIG. 9A) may be removed using, for example, a wet etch 180, and the area may be filled with a dielectric 182, e.g., silicon oxide or other appropriate dielectric, to form isolation region 108. Wet etch 180 may include any appropriate wet etching chemistry for porous silicon regions 124. Returning to FIG. 8, in another alternative embodiment, isolation region 108 (FIG. 2) may be formed by using porous silicon region 124 as a dielectric. This latter embodiment assumes that porous silicon region 124 has a sufficient porosity so as to have a sufficiently low dielectric constant to act as an isolation region.

The above-described embodiments may be applied in forming HBT 102. In this case, as shown in a completed manner in FIG. 2, conventional processing may be employed to form an extrinsic base layer 190 and emitter 192 to complete HBT 102. Regardless of which embodiment is used to ultimately form isolation region 108, use of porous silicon region 124 (FIG. 5) allows growth of a single crystalline intrinsic base 104 beyond collector region 106. The size of isolation region 108 and the size of intrinsic base 104 may be independent, which allows base resistance $R_b$ and collector 106 to base 104 capacitance $C_{cb}$ to be independent. As a result, a minimum base resistance $R_b$ from a large overlap area between intrinsic base 104 and extrinsic base layer 190 can be achieved, while simultaneously achieving a minimum collector-to-base capacitance $C_{cb}$ from a smaller overlap area between both intrinsic base 104 and extrinsic base 190 and collector 106. In addition, using the above-described embodiments, a very wide single crystal intrinsic base 104 can be achieved, further reducing $R_b$.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A structure comprising:
   a crystalline silicon intrinsic base extending beyond a collector region and extending over an isolation region, wherein all of an adjacent surface of the intrinsic base overlapping the collector region directly contacts the collector region, and wherein all of an adjacent surface of the intrinsic base overlapping the isolation region directly contacts the isolation region.

2. The structure of claim 1, wherein the isolation region includes a porous silicon dielectric.

3. The structure of claim 1, wherein the isolation region includes silicon oxide.

4. The structure of claim 1, wherein the isolation region includes porous silicon.

* * * * *